(12) United States Patent
Hanas et al.

(10) Patent No.: US 6,266,248 B1
(45) Date of Patent: Jul. 24, 2001

(54) LOCKABLE LATCH AND SWITCH ACTUATOR ASSEMBLY FOR A CIRCUIT CARD

(75) Inventors: Christopher PJ Hanas, Westfield; Liang Hwang, Old Bridge, both of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/436,852

(22) Filed: Nov. 9, 1999

(51) Int. Cl.[7] ................................................. H05K 5/00
(52) U.S. Cl. ............................................. 361/752; 439/116
(58) Field of Search .................................. 361/752, 800, 361/801, 802, 816, 818, 754, 759, 756; 439/116–120, 136, 137; 24/366, 371, 313, 294

(56) References Cited

U.S. PATENT DOCUMENTS 5,434,752 * 7/1995 Huth et al. ............................ 361/798
5,848,906 * 12/1998 Glusker et al. ....................... 439/157
B1 6,172,880 * 1/2001 Petitpierre et al. ................... 361/801

* cited by examiner

*Primary Examiner*—Jeffrey Gaffin
*Assistant Examiner*—Hung S Bui
(74) *Attorney, Agent, or Firm*—David L. Davis

(57) ABSTRACT

A lockable latch and switch actuator assembly for a circuit card includes a spring clip having a slot cooperating with a tab on a latch handle to lock the latch in its closed position. A release portion on the spring clip may be pushed to release the tab from the slot and unlock the latch. The other end of the spring clip is formed with an actuating portion which engages the actuator of a proximity switch mounted to the circuit card when the latch is in its locked position. This actuating portion is spring loaded so that when the latch is released from the locked position, the latch is pushed to an ajar position from which it can be moved to its fully open position.

9 Claims, 5 Drawing Sheets

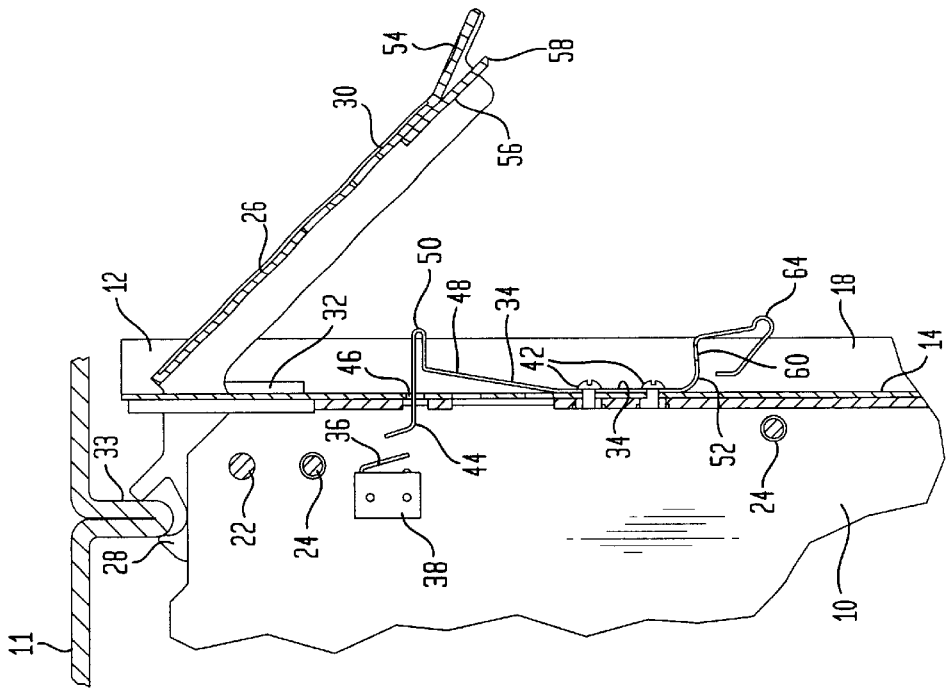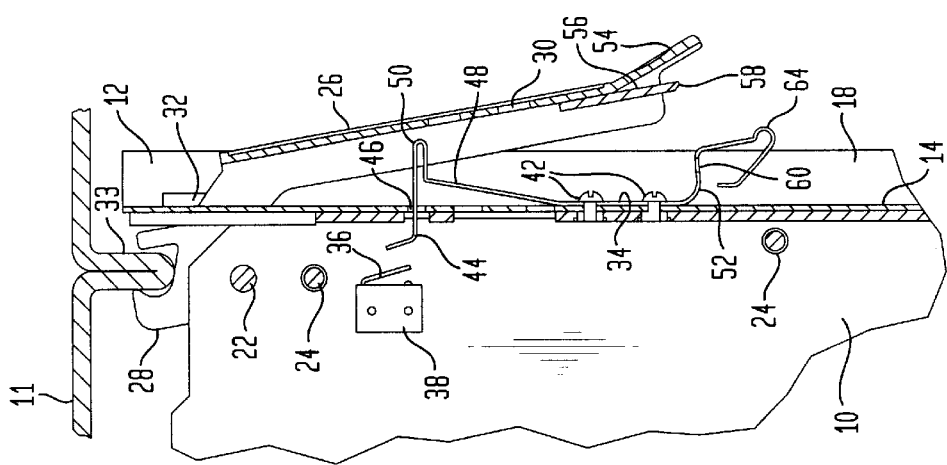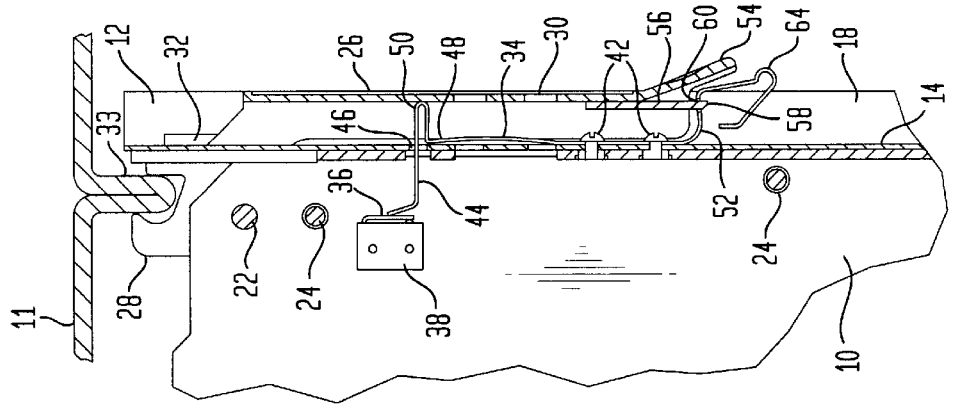

LOCKABLE LATCH AND SWITCH ACTUATOR ASSEMBLY FOR A CIRCUIT CARD

BACKGROUND OF THE INVENTION

This invention relates to a circuit card insertable into a card cage of an electronic system and, more particularly, to a lockable latch and switch actuator assembly for such a circuit card.

Modern electronic systems equipment, such as for telecommunications purposes, is often constructed as modular circuit cards inserted into guide slots of mechanical card cages, or shelf units, for engagement with a backplane mounted to the shelf unit at the inward ends of the guide slots. The outward edge of each circuit card is fastened to a faceplate assembly which holds a latch engagable with cooperating structure of the shelf unit to releasably retain the circuit card in the shelf unit. The locking mechanism for the latch typically includes a locking clip or button that protrudes out of the face of the latch. This can be unsightly and also decreases the space available for labeling of the circuit card. It would therefore be desirable to provide such a latch wherein the locking mechanism is less obtrusive.

A circuit card of the type described typically has mounted thereon a proximity switch which is actuated when the latch is in the position where it engages the cooperating structure of the shelf unit. Such a switch is typically activated through a direct force applied by the latch during the insertion operation of the circuit card into the card cage and is susceptible to being damaged by this direct force. It would therefore be desirable to provide a switch actuation mechanism which is not damaging to such a proximity switch.

SUMMARY OF THE INVENTION

According to the present invention, there is provided a faceplate assembly for a printed circuit card insertable into a shelf unit. The circuit card includes a switch having an actuator movable to a predetermined position when the circuit card is fully inserted in the shelf unit. The inventive assembly comprises a bracket member secured to an edge of the circuit card, a latch member pivotably mounted relative to the circuit card and a resilient clip secured to the bracket member. The latch member has a latch hook portion adjacent the circuit card and engagable with cooperating structure of the shelf unit to releasably retain the circuit card within the shelf unit. The latch member further has a handle portion extending through a first opening of the bracket member. The handle portion is terminated by a user engagable portion to allow a user to pivot the latch member. The clip has a first portion engagable with the latch member handle portion to yieldably bias the latch member toward a position where the latch hook portion is disengaged from the shelf unit cooperating structure. The clip also has a second portion extending through a second opening of the bracket member to engage the switch actuator and move the switch actuator to the predetermined position when the latch member is pivoted to a position where the latch hook portion engages the shelf unit cooperating structure.

In accordance with an aspect of this invention, the user engagable portion of the latch member further includes a tab having a distal end extending away from the pivotable mounting of the latch member. The clip further includes a retainer portion having an abutment for holding the latch member tab when the latch member is pivoted to the position where the latch hook portion engages the shelf unit cooperating structure.

BRIEF DESCRIPTION OF THE DRAWINGS

The foregoing will be more readily apparent upon reading the following description in conjunction with the drawings in which like elements in different figures thereof are identified by the same reference numeral and wherein:

FIGS. 5, 6 and 7 are partially sectioned side views corresponding to FIGS. 1, 2 and 3, respectively.

DETAILED DESCRIPTION

Figure 1:
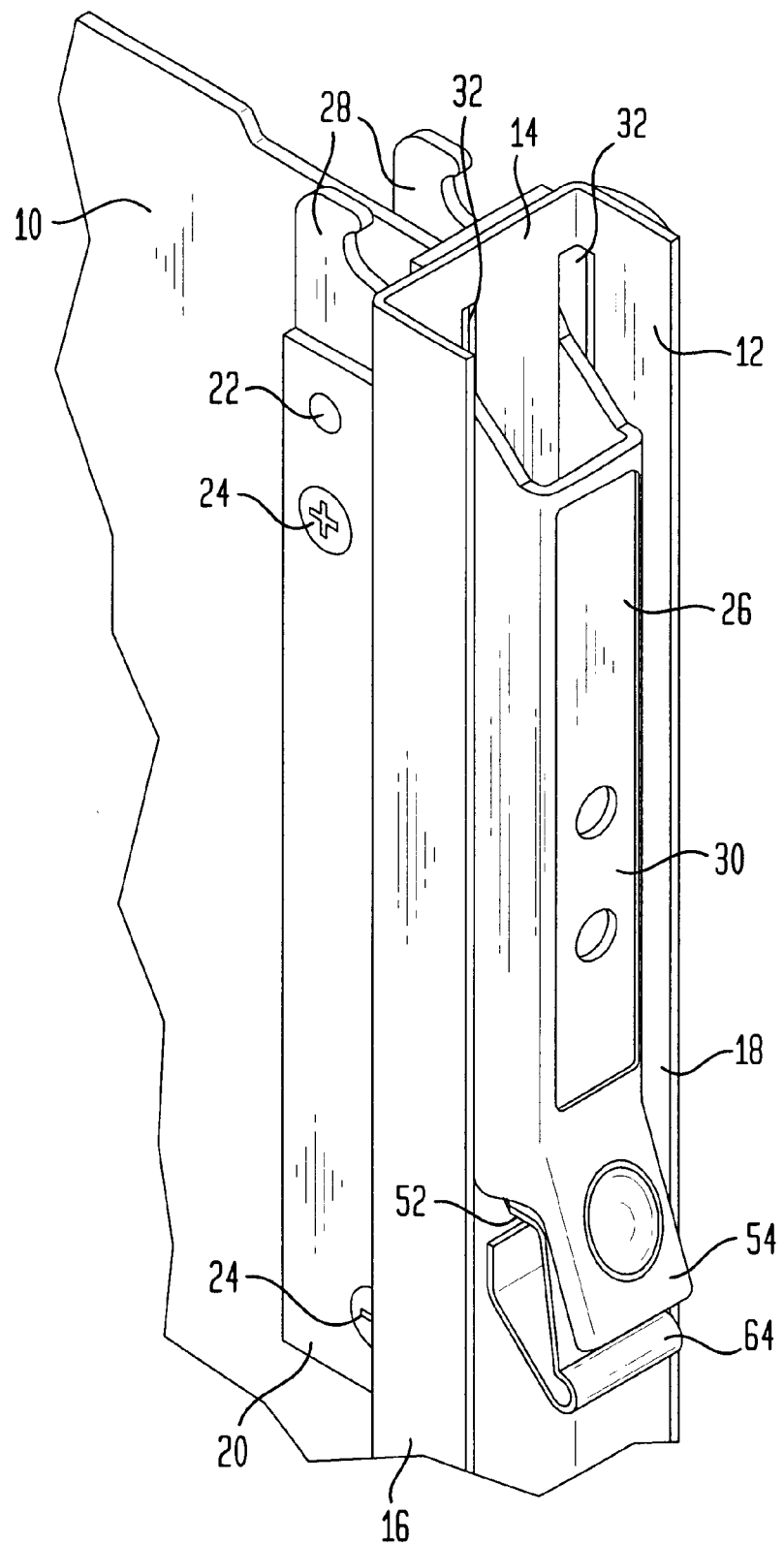
FIG. 1 is a partial perspective view of a circuit card including a lockable latch and switch actuator assembly according to the present invention in which the latch is in its locked position in which it can engage cooperating structure of a shelf unit in which the circuit card is inserted.

As shown in the drawings, a circuit card 10 adapted for insertion into a card cage, or shelf unit, (not shown) has a bracket member 12 secured along an edge. Preferably, the bracket member 12 is an elongated U-shaped bracket member arranged with its base wall 14 orthogonal to the circuit card 10 and its side walls 16, 18 extending parallel to and away from the circuit card 10. To attach the bracket member 12 to the circuit card 10, an L-shaped bracket (not shown) is secured to the base wall 14, as by spot welding or the like. The L-shaped bracket has a plurality of standoffs (not shown) press fit into openings therein and the circuit card 10 is placed at the distal end of the standoffs and secured thereto by screws extending through suitably placed openings in the circuit card 10. A plate member 20 is provided, with a pivot pin 22 press fit into a suitable opening of the plate member 20, and the plate member 20 is then secured to the L-shaped bracket standoffs by the screws 24.

Figure 3:
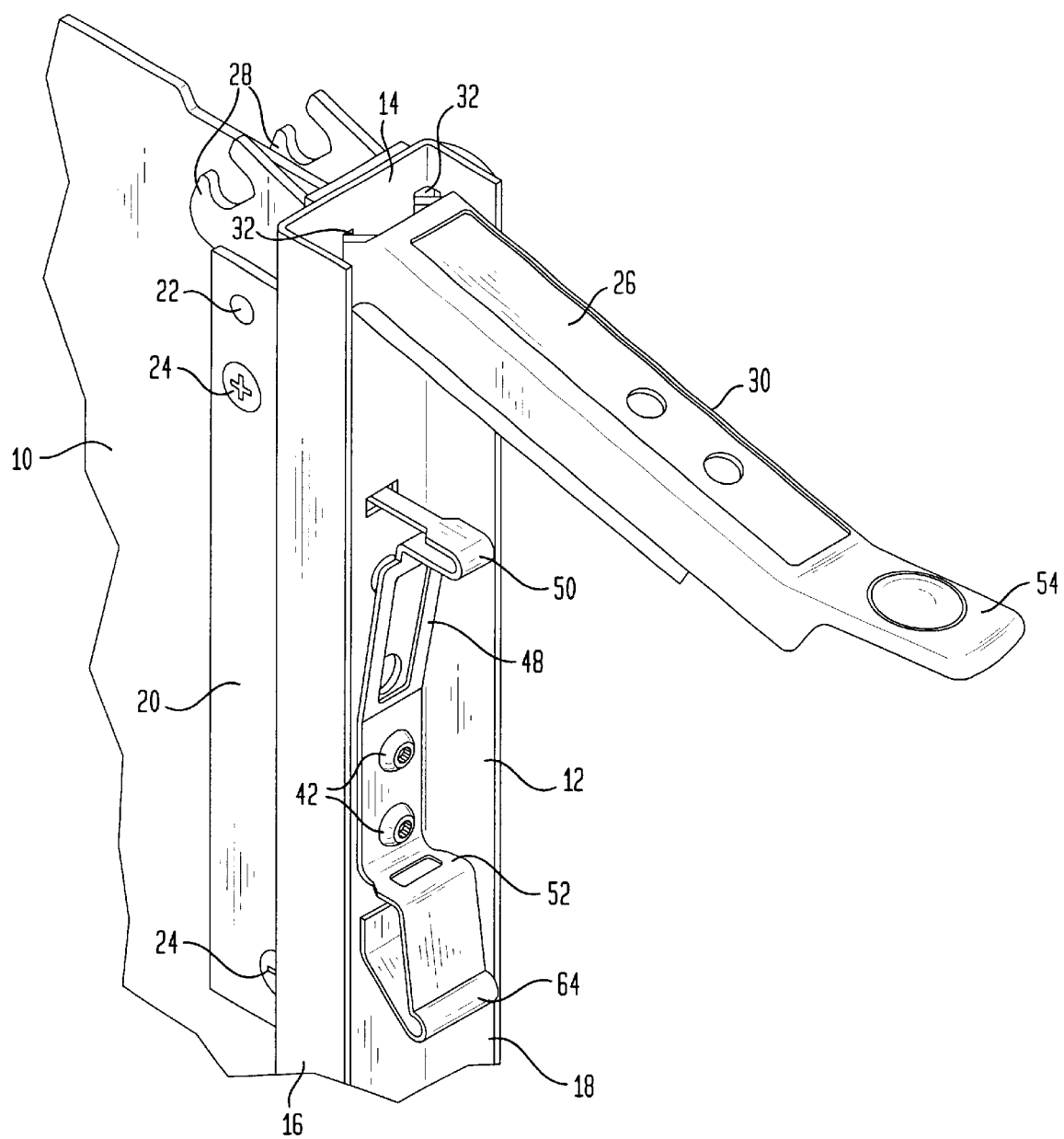
FIG. 3 is a view similar to FIGS. 1 and 2 showing the latch moved to its fully open position.

A latch member 26 is provided. The latch member 26 has a pair of latch hooks 28 and a handle portion 30. The latch member 26 extends through openings 32 in the bracket member 12 and is pivotably mounted relative to the circuit card 10 by having the pivot pin 22 extending through holes provided therefor in the latch hooks 28. The latch hooks 28 cooperate with structure of the shelf unit so that when the latch member 26 is in the locked position shown in FIGS. 1 and 5, the circuit card 10 is retained within the shelf unit. When the latch member 26 is pivoted to the positions shown in FIGS. 3 and 7, the latch hooks 28 are released from the cooperating structure of the shelf unit to allow removal or installation of the circuit card 10.

Figure 2:
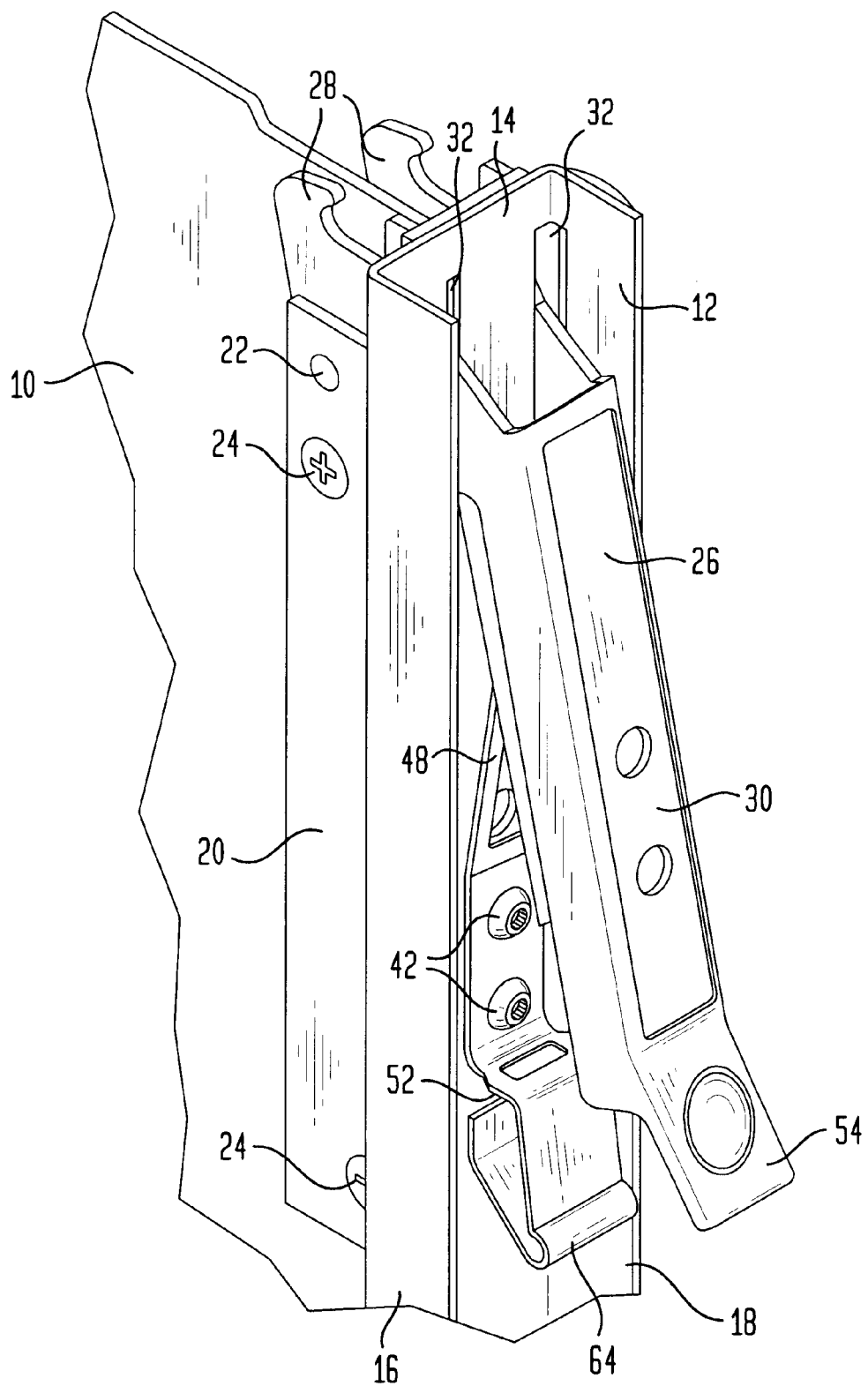
FIG. 2 is a view similar to FIG. 1 showing the latch in an ajar position released from the locking position of FIG. 1.
Figure 4:
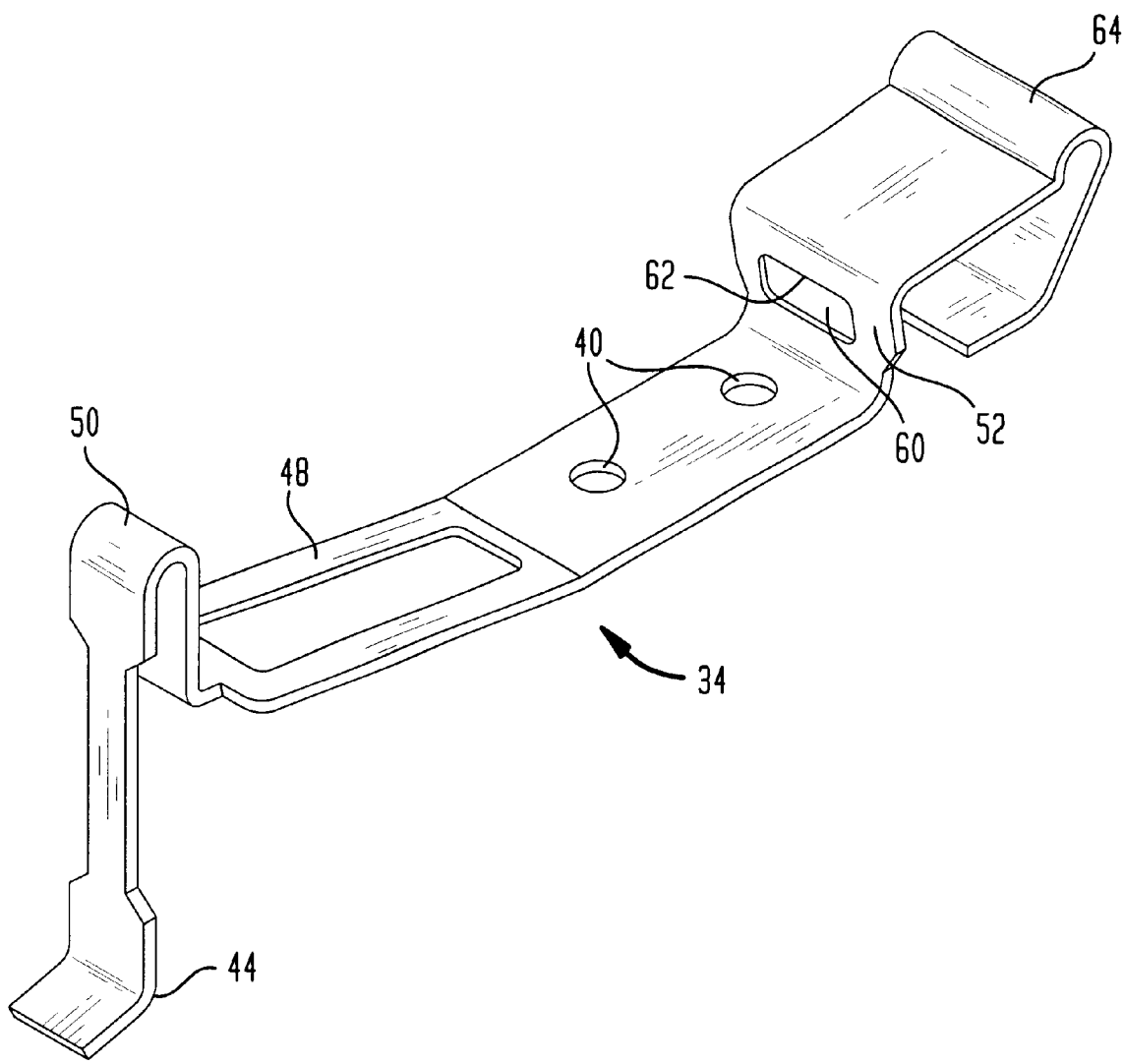
FIG. 4 is a perspective view of an embodiment of a clip according to the present invention.

To provide a locking, quick release and switch actuation function, a resilient clip 34, as best seen in FIG. 4, is provided. The clip 34 provides three functions. First, it locks the latch member 26 in the position shown in FIGS. 1 and 5. Second, it provides a quick release function to release the latch member 26 to the ajar position shown in FIGS. 2 and 6. Third, it engages the actuator 36 of the proximity switch 38 mounted to the circuit card 10, as shown in FIG. 5, when the latch member 26 is in the locked position where the latch hooks 28 engage the cooperating structure of the shelf unit, as shown in FIGS. 1 and 5. Preferably, the clip 34 is a one piece unit, formed from sheet material, but it is understood that it could be formed of two pieces.

The clip 34 is formed with a pair of holes 40 which are used to secure the clip 34 to the bracket member 12 by the screws 42. The clip 34 includes an actuating portion 44 which extends through an opening 46 in the bracket member 12 to engage the switch actuator 36. The actuating portion 44 is connected to a spring portion 48 which is preferably bent away from the base wall 14 of the bracket member 12 by an angle of approximately 10°. Between the spring portion 48 and the actuating portion 44, the clip 34 is formed with an engagement portion 50 which engages the underside of the handle portion 30 of the latch member 26. The other end of the clip 34 is formed with a retainer portion 52 which has an abutment for holding the latch member 26 in the locked position shown in FIGS. 1 and 5, as will be described. At its end remote from the pivotal mounting point, the latch member 26 handle portion 30 is terminated by a user engagable portion 54 which provides a place for the user to hold the latch member 26 and pivot it about the pivot pin 22. Part of the user engagable portion 54 is a tab 56 which has a distal end 58 extending away from the pivotable mounting of the latch member 26. The tab 58 cooperates with the abutment of the clip 34 engagement portion 50, as will be described.

The retainer portion 52 is formed with a slot opening 60, the upper peripheral edge 62 thereof functioning as the abutment cooperating with the distal end 58 of the tab 56. Beyond the retainer portion 52, the clip 34 is formed with a user engagable release portion 64.

In use, when the latch member 26 is pivoted to the locked position shown in FIGS. 1 and 5, the engagement portion 50 of the clip 34 is contacted by the underside of the latch member 26 handle portion 30 and is moved to the left, as viewed in FIG. 5, against the biasing force of the spring portion 48, sufficiently that the actuating portion 44 engages the actuator 36 of the proximity switch 38. Because of the resiliency of the clip 34, the force against the actuator 36 is attenuated, thereby preventing damage to the switch 38. The distal end 58 of the tab 56 is formed as an angled camming surface so that as the latch member 26 is pivoted to the locked position, the retainer portion 52 is moved to allow the tab 56 to pass the abutment formed by the edge 62 and snap into the opening 60. The latch member 26 is thus effectively locked in position.

When it is desired to remove the circuit card 10 from the shelf unit, the latch hooks 28 must be disengaged from the cooperating structure of the shelf unit. Accordingly, the user depresses the exposed release portion 64 of the clip 34. This moves the abutment 62 beyond the distal end 58 of the tab 56, freeing the latch member 26. Due to the biasing force applied by the spring portion 48, the engagement portion 50 pivots the latch member 20 to the ajar position shown in FIGS. 2 and 6. The user may then grasp the portion 54 of the latch member 26 and pivot the latch member 26 to the open position shown in FIGS. 3 and 7, where the latch hooks 28 are totally disengaged from the cooperating structure of the shelf unit.

Accordingly, there has been disclosed a lockable latch and switch actuator assembly for a circuit card insertable into a card cage of an electronic system. While an exemplary embodiment of the present invention has been disclosed herein, it is understood that various adaptations and modifications to the disclosed embodiment are possible and it is intended that this invention be limited only by the scope of the appended claims.

What is claimed is:

1. A faceplate assembly including a printed circuit card insertable into a shelf unit, the circuit card including a switch having an actuator movable to a predetermined position when the circuit card is fully inserted in the shelf unit, the assembly comprising:

a bracket member secured to an edge of the circuit card;

a latch member pivotably mounted relative to the circuit card, the latch member having a latch hook portion adjacent the circuit card and engagable with cooperating structure of the shelf unit to releasably retain the circuit card within the shelf unit, and the latch member further having a handle portion extending through a first opening of the bracket member and terminated by a user engagable portion to allow a user to pivot the latch member; and a resilient clip secured to the bracket member, the clip having a first portion engagable with the latch member handle portion to yieldably bias the latch member toward a position where the latch hook portion is disengaged from the shelf unit cooperating structure, and the clip having a second portion extending through a second opening of the bracket member to engage the switch actuator and move the switch actuator to the predetermined position when the latch member is pivoted to a position where the latch hook portion engages the shelf unit cooperating structure.

2. The assembly according to claim 1 wherein:

the user engagable portion of the latch member further includes a tab having a distal end extending away from the pivotable mounting of the latch member; and the clip further includes a retainer portion having an abutment for holding the latch member tab when the latch member is pivoted to the position where the latch hook portion engages the shelf unit cooperating structure.

3. The assembly according to claim 2 wherein the clip is formed with an opening, with a peripheral edge of the clip opening functioning as the abutment.

4. The assembly according to claim 2 wherein the clip further includes a user engagable resilient release portion extending away from the bracket member and arranged to release the latch member tab from the clip abutment when the release portion is moved toward the bracket member.

5. The assembly according to claim 4 wherein the distal end of the latch member tab is formed as a camming surface to move the clip retainer portion to allow the tab to pass the abutment as the latch member is pivoted to the position where the latch hook portion engages the shelf unit cooperating structure.

6. A lockable latch assembly for a printed circuit card insertable into a shelf unit, the assembly comprising:

a bracket member secured to an edge of the circuit card;

a latch member pivotably mounted relative to the circuit card, the latch member having a latch hook portion adjacent the circuit card and engagable with cooperating structure of the shelf unit to releasably retain the circuit card within the shelf unit, and the latch member further having a handle portion extending through a first opening of the bracket member and terminated by a user engagable portion to allow a user to pivot the latch member, wherein the user engagable portion of the latch member includes a tab having a distal end extending away from the pivotable mounting of the latch member; and a resilient clip secured to the bracket member, the clip having a retainer portion including an abutment for holding the latch member tab when the latch member is pivoted to the position where the latch hook portion engages the shelf unit cooperating structure.

7. The assembly according to claim 6 wherein the clip is formed with an opening, with a peripheral edge of the clip opening functioning as the abutment.

8. The assembly according to claim 6 wherein the clip further includes a user engagable resilient release portion extending away from, the bracket member and arranged to release the latch member tab from the clip abutment when the release portion is moved toward the bracket member.

9. The assembly according to claim 8 wherein the distal end of the latch member tab is formed as a camming surface to move the clip retainer portion to allow the tab to pass the abutment as the latch member is pivoted to the position where the latch hook portion engages the shelf unit cooperating structure.

* * * * *